US009577131B2

(12) United States Patent
Saito et al.

(10) Patent No.: US 9,577,131 B2
(45) Date of Patent: Feb. 21, 2017

(54) CONCENTRATOR PHOTOVOLTAIC MODULE, CONCENTRATOR PHOTOVOLTAIC PANEL, AND FLEXIBLE PRINTED CIRCUIT FOR CONCENTRATOR PHOTOVOLTAIC MODULE

(71) Applicant: Sumitomo Electric Industries, Ltd., Osaka-shi, Osaka (JP)

(72) Inventors: Kenji Saito, Osaka (JP); Takashi Iwasaki, Osaka (JP); Kazumasa Toya, Osaka (JP); Yoshiya Abiko, Osaka (JP); Kenichi Hirotsu, Osaka (JP); Youichi Nagai, Osaka (JP); Hideaki Nakahata, Osaka (JP); Rui Mikami, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/285,800

(22) Filed: May 23, 2014

(65) Prior Publication Data

US 2015/0027510 A1    Jan. 29, 2015

(30) Foreign Application Priority Data

Mar. 26, 2013  (JP) .................................. 2013-064123
Mar. 12, 2014  (JP) .................................. 2014-049169

(51) Int. Cl.
*H01L 31/048* (2014.01)
*H01L 31/054* (2014.01)
(Continued)

(52) U.S. Cl.
CPC ......... *H01L 31/048* (2013.01); *H01L 31/0201* (2013.01); *H01L 31/02008* (2013.01);
(Continued)

(58) Field of Classification Search
CPC ...... H01L 31/048; H01L 31/05; H01L 31/054; H01L 31/0543; H01L 31/0547; H01L 51/5237; H01L 51/524; H02S 40/20; H02S 40/30
(Continued)

(56) References Cited

U.S. PATENT DOCUMENTS 8,998,454 B2 *  4/2015  Wang et al. .................. 362/294
2011/0132432 A1  6/2011  Schultz et al.
2013/0146120 A1 *  6/2013  Seel et al. ..................... 136/246

FOREIGN PATENT DOCUMENTS

AU   2010325146 A1   6/2012
CN     102812556 A  12/2012
(Continued)

OTHER PUBLICATIONS

Homi Ahmadi, "Calculating creepage and clearance early avoids design problems later" Mar. 2001.*
(Continued)

*Primary Examiner* — Devina Pillay
*Assistant Examiner* — Daniel Malley, Jr.
(74) *Attorney, Agent, or Firm* — Ditthavong & Steiner, P.C.

(57) ABSTRACT

A concentrator photovoltaic module including: a flexible printed circuit provided in contact with a bottom surface of a housing; and a primary concentrating portion formed by a plurality of lens elements being arranged, each lens element concentrating sunlight, wherein the flexible printed circuit includes: an insulating base material and a conductive pattern; a plurality of power generating elements provided on the pattern, so as to correspond to the lens elements, respectively; a cover lay as a covering layer having insulating property and a low water absorption not higher than a predetermined value, the cover lay covering and sealing a conductive portion including the pattern on the insulating base material; and an adhesive layer having insulating property and a low water absorption not higher than the predetermined value, the adhesive layer bonding the insulating base material and the covering layer together.

11 Claims, 14 Drawing Sheets

(51) Int. Cl.
  *H01L 31/02* (2006.01)
  *H01L 31/05* (2014.01)
  *H01L 31/044* (2014.01)
(52) U.S. Cl.
  CPC ........ *H01L 31/044* (2014.12); *H01L 31/0508* (2013.01); *H01L 31/0543* (2014.12); *H02S 20/32* (2014.12); *Y02E 10/52* (2013.01)
(58) Field of Classification Search
  USPC .................. 136/251, 256, 259, 246, 244
  See application file for complete search history.

(56) References Cited

FOREIGN PATENT DOCUMENTS

| EP | 2077586 | A1 | 7/2009 |
|---|---|---|---|
| EP | 2504859 | A1 | 10/2012 |
| IL | 184507 | B | 5/2012 |
| JP | 2003-174179 | A | 6/2003 |
| JP | 2008-091440 | A | 4/2008 |
| JP | 2013512565 | A | 4/2013 |
| JP | 2013084855 | A | 5/2013 |
| JP | 2013149831 | A | 8/2013 |
| KR | 20120113737 | A | 10/2012 |
| TW | 201324817 | A | 6/2013 |
| WO | 2008050392 | A1 | 5/2008 |
| WO | 2011065975 | A1 | 6/2011 |
| WO | 2013054709 | A1 | 4/2013 |

OTHER PUBLICATIONS

Meneses-Rogriguez et al., "Photovoltaic solar cells performance at elevated temperatures" Jul. 2003.*
Emcore Corporation, "Failure Modes of CPV Modules and How to Test for Them," Feb. 19, 2010, http://www1.eere.energy.gov/solar/pdfs/pvrw2010_aeby.pdf#search='emcore Pointfocus Fresnel Lens HCPV System', last visited on Feb. 27, 2013, 95 pages.
International Search Report for International Patent Application No. PCT/JP2014/063348, mailed Jul. 22, 2014, 2 Pages.

* cited by examiner

CONCENTRATOR PHOTOVOLTAIC MODULE, CONCENTRATOR PHOTOVOLTAIC PANEL, AND FLEXIBLE PRINTED CIRCUIT FOR CONCENTRATOR PHOTOVOLTAIC MODULE

TECHNICAL FIELD

The present invention relates to a concentrator photovoltaic (CPV) for generating power by concentrating sunlight on a power generating element.

BACKGROUND ART

Concentrator photovoltaic is based on a structure in which sunlight concentrated by a lens is caused to be incident on a power generating element (solar cell) formed by a small-sized compound semiconductor having a high power generation efficiency. By causing a concentrator photovoltaic panel provided with a plurality of such basic components to perform tracking operation so as to always face the sun, a desired generated power can be obtained. Specifically, for example, a plurality of insulating substrates such as ceramics with wiring, each insulating substrate having one power generating element mounted thereon, are arranged at light-concentrating positions, and generated power on each insulating substrate is collected by an electric wire (for example, see NON PATENT LITERATURE 1).

Other than this, a concentrator photovoltaic apparatus taking heat dissipating property into consideration has been also proposed (for example, see PATENT LITERATURE 1 and 2).

CITATION LIST

Patent Literature

PATENT LITERATURE 1: Japanese Laid-Open Patent Publication No. 2003-174179
PATENT LITERATURE 2: Japanese Laid-Open Patent Publication No. 2008-91440

Non Patent Literature

NON PATENT LITERATURE 1: "Failure Modes of CPV Modules and How to Test for Them", [online], Feb. 19, 2010, Emcore Corporation, [Retrieved on Feb. 27, 2013] Internet <URL: http://www1.eere.energy.gov/solar/pdfs/pvrw2010_aeby.pdf#search='emcore Pointfocus Fresnel Lens HCPV System'>

SUMMARY OF INVENTION

Technical Problem

However, the conventional concentrator photovoltaic panel described above requires a large number of insulating substrates such as ceramics. When the large number of insulating substrates are to be arranged and connected to each other with an electric wire respectively, the number of manufacturing steps is increased, and a long time is taken. As a result, manufacturing costs are increased, and a product having a practically appropriate price cannot be obtained. If a large substrate is fabricated, the number of manufacturing steps is decreased. However, the photovoltaic panel originally requires a large area. Thus, the substrate has to be enlarged considerably. However, making such a large substrate is difficult in terms of manufacturing technique.

As described above, mounting a large number of small substrates and mutually connecting them take a long time. On the other hand, making a large substrate is difficult in terms of manufacturing technique.

Moreover, with regard to a conventional concentrator photovoltaic panel, neither clear teaching nor a viewpoint regarding insulating performance is shown. Inside the photovoltaic panel, a high voltage occurs due to a series connection of the power generating elements. In addition, since the photovoltaic panel is installed in the outside, water vapor that has entered inside the panel may cause dew condensation due to change in air temperature. Moreover, small insects may enter inside the panel. As a result, there are cases where a short circuit inside the electric circuit, or a short circuit (grounding) from the electric circuit to the housing of the panel is caused due to moisture or an insect. In such cases, output decreases, and when a person touches the housing, a light electric shock may be caused.

Further, with lapse of years, in conductive portions inside the panel, rust occurs at copper patterns and solder portions, and this causes increase of resistance in the electric circuit. When the resistance increases, the output of the photovoltaic panel decreases.

In view of the conventional problems, the present invention is intended, with regard to a structure of a substrate for concentrator photovoltaic, to facilitate manufacture and mounting thereof, to enhance insulating performance, and to suppress deterioration over time of conductive portions.

Solution to Problem

The present invention is a concentrator photovoltaic module including: a housing formed in a vessel shape and having a bottom surface; a flexible printed circuit provided in contact with the bottom surface; and a concentrating portion attached to the housing and formed by a plurality of lens elements being arranged, each lens element concentrating sunlight, wherein the flexible printed circuit includes: an insulating base material having insulating property, and a pattern having conductivity and provided on the insulating base material; a plurality of power generating elements provided on the pattern, so as to correspond to the lens elements, respectively; a covering layer having insulating property and a low water absorption not higher than a predetermined value, the covering layer covering and sealing a conductive portion including the pattern on the insulating base material; and an adhesive layer having insulating property and a low water absorption not higher than the predetermined value, the adhesive layer bonding the insulating base material and the covering layer together.

In the concentrator photovoltaic module structured as above, by providing the power generating elements on an insulating base material having appropriate dimensions that facilitate manufacture, it is possible to easily manufacture a flexible printed circuit having a concentrator photovoltaic function. Moreover, the flexible printed circuit can be laid throughout in a desired size (area), and thus, is suitable for a large-sized concentrator photovoltaic module. Further, the flexible printed circuit is thin and has a light weight, and thus, the entirety of the concentrator photovoltaic module also has a light weight, and thus, handling thereof becomes easy. In addition, the flexible printed circuit is thin and flexible, and thus, is easily attached in close contact with the bottom surface of the housing. Moreover, due to the close contact and the thinness, heat from the power generating element and other flexible printed circuits can be assuredly dissipated to the housing.

Moreover, the conductive portion including the pattern is covered and sealed with the covering layer and the adhesive layer each having insulating property and a low water absorption. Thereby, a creepage distance from the conductive portion to the bottom surface of the housing is ensured, and excellent insulating performance can be realized. Moreover, by the covering layer and the adhesive layer each having a low water absorption, corrosion of the conductive portion can be prevented and deterioration over time can be suppressed.

On the other hand, a flexible printed circuit for a concentrator photovoltaic module of the present invention includes: an insulating base material having insulating property, and a pattern having conductivity and provided on the insulating base material; a plurality of power generating elements provided by being arranged on the pattern; a covering layer having insulating property and a low water absorption not higher than a predetermined value, the covering layer covering and sealing a conductive portion including the pattern on the insulating base material; and an adhesive layer having insulating property and a low water absorption not higher than the predetermined value, the adhesive layer bonding the insulating base material and the covering layer together.

In the flexible printed circuit for a concentrator photovoltaic module structured as above, by providing the power generating element and the concentrating portion on an insulating base material having appropriate dimensions that facilitate manufacture, it is possible to easily manufacture a flexible printed circuit having a concentrator photovoltaic function. Moreover, the flexible printed circuit can be laid throughout in a desired size (area), and thus, is suitable as a substrate for a large-sized concentrator photovoltaic module.

Moreover, the conductive portion including the pattern is covered and sealed with the covering layer and the adhesive layer each having insulating property and a low water absorption. Thereby, in a case where the flexible printed circuit is attached to a housing made of metal, a creepage distance from the conductive portion to the bottom surface of the housing is ensured. Accordingly, excellent insulating performance can be realized. Moreover, by the covering layer and the adhesive layer each having a low water absorption, corrosion of the conductive portion can be prevented and deterioration over time can be suppressed.

Advantageous Effects of Invention

According to the concentrator photovoltaic module of the present invention, with regard to a structure of a substrate for concentrator photovoltaic, it is possible to realize a structure of the substrate that facilitates manufacture and mounting thereof, that is excellent in insulating performance, and that suppresses deterioration over time of the conductive portion.

DESCRIPTION OF EMBODIMENTS

Summary of Embodiments

Figure 1:
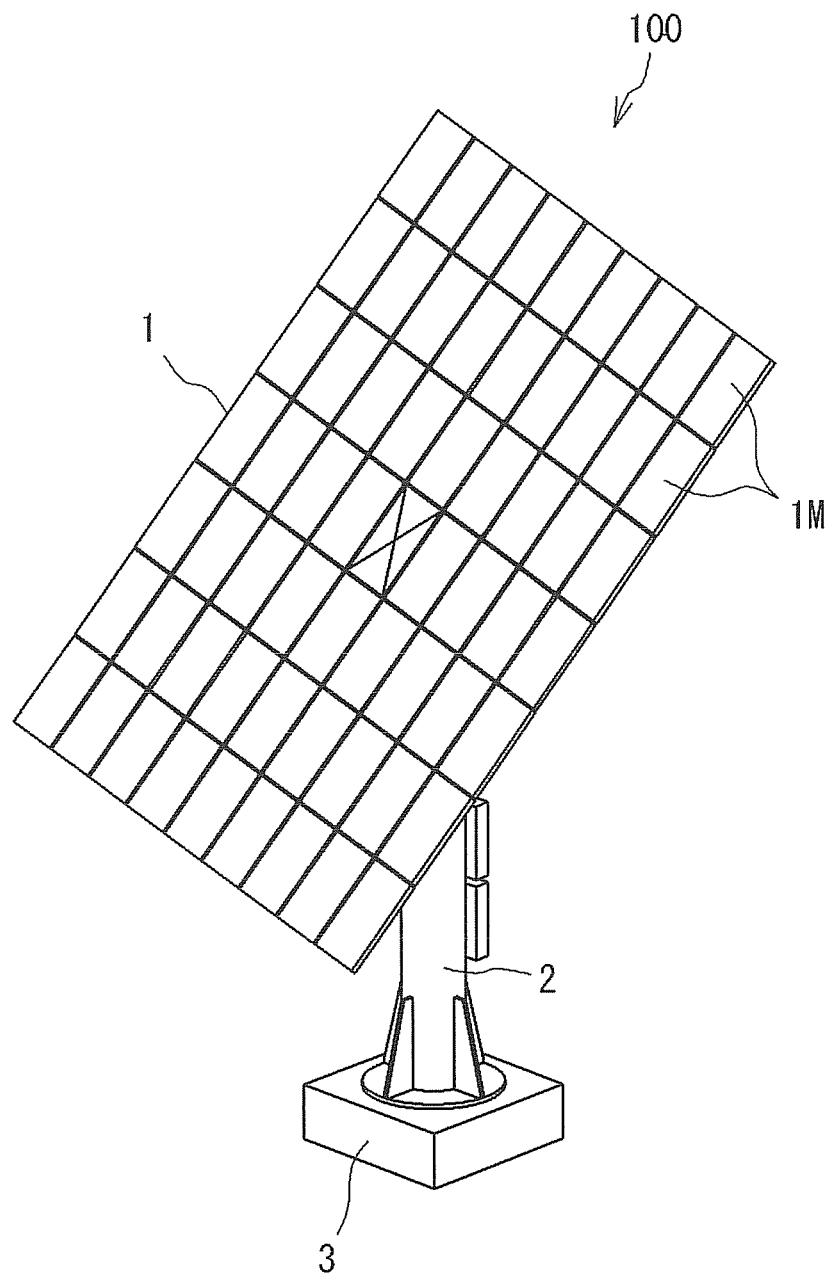
FIG. 1 is a perspective view showing a concentrator photovoltaic apparatus according to one embodiment of the present invention.

A summary of embodiments of the present invention includes the following at least.

(1) First, a concentrator photovoltaic module includes: a housing formed in a vessel shape and having a bottom surface; a flexible printed circuit provided in contact with the bottom surface; and a concentrating portion attached to the housing and formed by a plurality of lens elements being arranged, each lens element concentrating sunlight, wherein the flexible printed circuit includes: an insulating base material having insulating property, and a pattern having conductivity and provided on the insulating base material; a plurality of power generating elements provided on the pattern, so as to correspond to the lens elements, respectively; a covering layer having insulating property and a low water absorption not higher than a predetermined value, the covering layer covering and sealing a conductive portion including the pattern on the insulating base material; and an adhesive layer having insulating property and a low water absorption not higher than the predetermined value, the adhesive layer bonding the insulating base material and the covering layer together.

In the concentrator photovoltaic module structured as in the (1), by providing the power generating element on an insulating base material having appropriate dimensions that facilitate manufacture, it is possible to easily manufacture a flexible printed circuit having a concentrator photovoltaic function. Moreover, the flexible printed circuit can be laid throughout in a desired size (area), and thus is suitable for a large-sized concentrator photovoltaic module. Moreover, the flexible printed circuit is thin and has a light weight, and thus, the entirety of the concentrator photovoltaic module also has a light weight, and thus, handling thereof becomes easy. In addition, the flexible printed circuit is thin and flexible, and thus, is easily attached in close contact with the bottom surface of the housing. Further, due to the close contact and the thinness, heat from the power generating element and other flexible printed circuits can be assuredly dissipated to the housing.

Moreover, the conductive portion including the pattern is covered and sealed with the covering layer and the adhesive layer each having insulating property and a low water absorption. Thereby, a creepage distance from the conductive portion to the bottom surface of the housing is ensured, and excellent insulating performance can be realized. Moreover, by the covering layer and the adhesive layer each having a low water absorption, corrosion of the conductive portion can be prevented, and deterioration over time can be suppressed.

(2) Further, in the concentrator photovoltaic module of the (1), the predetermined value is 3%.

In this case, the covering layer and the adhesive layer hardly absorb water, and thus, excellent insulating performance can be maintained.

(3) Further, in the concentrator photovoltaic module of the (1) or (2), the flexible printed circuit may be formed by the insulating base material of a ribbon shape being arranged on the bottom surface, the insulating base material having the power generating elements mounted thereon.

In this case, the flexible printed circuit can be laid throughout in a desired size while the area thereof is suppressed to a necessary minimum. Moreover, in the longitudinal direction, the power generating elements can be arranged in advance at a certain interval. This facilitates mutual positioning between each lens element and a corresponding power generating element, and realizes excellent productivity.

(4) Further, in the concentrator photovoltaic module according to any one of the (1) to (3), it may be configured such that the insulating base material is attached to the bottom surface via a bottom surface adhesive layer having insulating property.

In this case, insulating property of the insulating base material viewed from the housing is enhanced. Moreover, the adhesive layer itself can be formed thin, and thus, heat dissipating property from the insulating base material to the housing is not impaired by the bottom surface adhesive layer.

(5) Moreover, in the concentrator photovoltaic module of the (1) to (4), preferably, a potting layer is provided which covers a portion, including the power generating element, where the conductive portion is locally exposed, and the potting layer has insulating property and a water absorption not higher than the predetermined value.

In this case, conductive portions, such as electrodes of the power generating element, a diode, a solder connection portion, and the like, that cannot be sufficiently covered with the covering layer and thus are exposed are covered with the potting layer, whereby these conductive portions can be prevented from being exposed. Accordingly, insulating performance can be enhanced. Moreover, the width of the insulating base material can be made close to the width of the element mounted thereon. Accordingly, a more slender insulating base material can be used, and costs can be reduced.

(6) Moreover, in the concentrator photovoltaic module according to any one of the (1) to (5), preferably, a creepage distance from the pattern to the bottom surface is 0.2 to 34.9 mm.

In this range, both maintaining of insulating performance and low costs can be realized. It should be noted that the value of 34.9 mm is based on the maximum value of the width of the insulating base material and the minimum value of the width of the pattern.

(7) Moreover, in the concentrator photovoltaic module according to any one of the (1) to (6), preferably, a width of the insulating base material is 0.6 to 70 mm.

In this range, both maintaining of insulating performance and low costs can be realized. It should be noted that the value of 0.6 mm is based on the minimum value of the creepage distance and the minimum value of the width of the pattern.

(8) Moreover, in the concentrator photovoltaic module according to any one of the (1) to (7), preferably, a width of the pattern is 0.2 to 69.6 mm.

Accordingly, both insulating performance and low costs can be realized. That is, in the case of less than 0.2 mm, not only insulating performance cannot be sufficiently ensured, but also stable manufacture at a low price cannot be realized. Moreover, realizing greater than 69.6 mm increases practical costs too much. It should be noted that the value of 69.6 mm is based on the maximum value of the width of the insulating base material and the minimum value of the creepage distance.

(9) Moreover, in the concentrator photovoltaic module according to any one of the (1) to (8), preferably, a ratio between a package width of the power generating element and a width of the insulating base material is 1: (1.2 to 2).

In this range, maintaining of insulating performance and low costs can be realized.

(10) Moreover, in the concentrator photovoltaic module according to any one of the (1) to (9), preferably, a width of the bottom surface adhesive layer is greater than a width of the insulating base material.

In this case, the creepage distance is extended by the length by which the width of the bottom surface adhesive layer is greater than the width of the insulating base material. Accordingly, insulating performance can be enhanced.

(11) Moreover, in the concentrator photovoltaic module according to any one of the (1) to (10), inside the bottom surface adhesive layer, at least one metal plate may be provided in a thickness direction of the layer.

In this case, insulating performance of the insulating base material relative to the housing can be enhanced.

(12) Moreover, a concentrator photovoltaic panel is formed by assembling a plurality of the concentrator photovoltaic modules according to the (1).

In this case, by use of the concentrator photovoltaic module exhibiting the operations and effects described above, a concentrator photovoltaic panel having a desired size can be formed.

(13) Meanwhile, a flexible printed circuit for a concentrator photovoltaic module includes: an insulating base material having insulating property, and a pattern having conductivity and provided on the insulating base material; a plurality of power generating elements provided by being arranged on the pattern; a covering layer having insulating property and a low water absorption not higher than a predetermined value, the covering layer covering and sealing a conductive portion including the pattern on the insulating base material; and an adhesive layer having insulating property and a low water absorption not higher than the predetermined value, the adhesive layer bonding the insulating base material and the covering layer together.

In the flexible printed circuit for a concentrator photovoltaic module structured as described above, by providing the power generating element and the concentrating portion on an insulating base material having appropriate dimensions that facilitate manufacture, it is possible to easily manufacture a flexible printed circuit having a concentrator photovoltaic function. Moreover, the flexible printed circuit can be laid throughout in a desired size (area), and thus, is suitable as a substrate for a large-sized concentrator photovoltaic module.

Moreover, the conductive portion including the pattern is covered and sealed with the covering layer and the adhesive layer each having insulating property and a low water absorption. Thereby, in a case where the flexible printed circuit is attached to a housing made of metal, a creepage distance from the conductive portion to the bottom surface of the housing is ensured. Accordingly excellent insulating performance can be realized. Moreover, by the covering layer and the adhesive layer each having a low water absorption, corrosion of the conductive portion can be prevented and deterioration over time can be suppressed.

Details of Embodiments

FIG. 1 is a perspective view showing a concentrator photovoltaic apparatus according to one embodiment of the present invention. In the drawing, a concentrator photovoltaic apparatus 100 includes a concentrator photovoltaic panel 1, a post 2 which supports the concentrator photovoltaic panel 1 at the center of the rear surface thereof, and a base 3 to which the post 2 is attached. The concentrator photovoltaic panel 1 is formed by assembling, for example, 62 (7 in length×9 in breadth−1) concentrator photovoltaic modules 1M vertically and horizontally, except the center portion that is used for connection to the post 2. One concentrator photovoltaic module 1M has a rated output of, for example, about 100 W, and the entirety of the concentrator photovoltaic panel 1 has a rated output of about 6 kW. The concentrator photovoltaic panel 1 can be rotated about the post 2 by a rotation mechanism not shown and provided on the rear surface thereof, and can be caused to track the sun so as to always face a direction of the sun.

Figure 2:
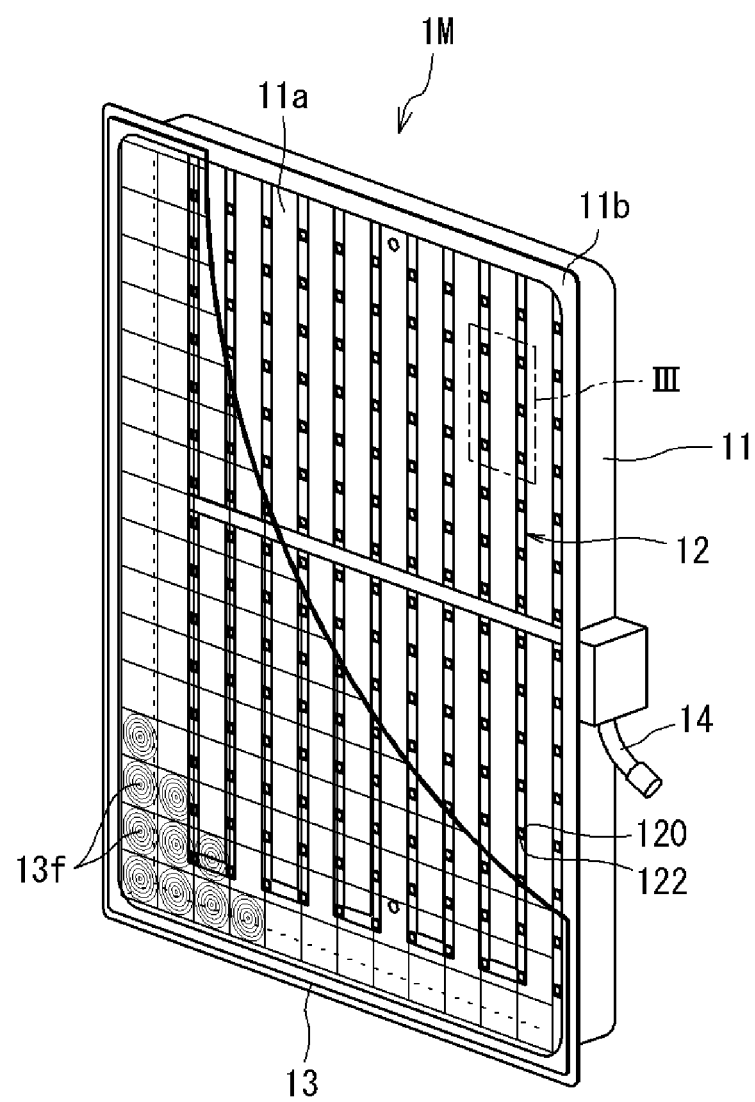
FIG. 2 is a perspective view (partially cut out) showing an enlarged view of a concentrator photovoltaic module.

FIG. 2 is a perspective view (partially cut out) showing an enlarged view of the concentrator photovoltaic module (hereinafter, simply referred to as module) 1M. In the drawing, the module 1M includes, as main components, a housing 11 formed in a vessel shape (vat shape) and having a bottom surface 11a, a flexible printed circuit 12 provided in contact with the bottom surface 11a, and a primary concentrating portion 13 attached, like a cover, to a flange portion 11b of the housing 11. The housing 11 is made of metal.

The primary concentrating portion 13 is a Fresnel lens array and is formed by arranging, in a matrix shape, a plurality of (for example, 16 in length×12 in breadth, 192) Fresnel lenses 13f as lens elements which concentrate sunlight. The primary concentrating portion 13 can be obtained by, for example, forming a silicone resin film on a back surface (inside) of a glass plate used as a base material. Each Fresnel lens is formed on this resin film. On the external surface of the housing 11, a connector 14 for taking out an output from the module 1M is provided.

Figure 3:
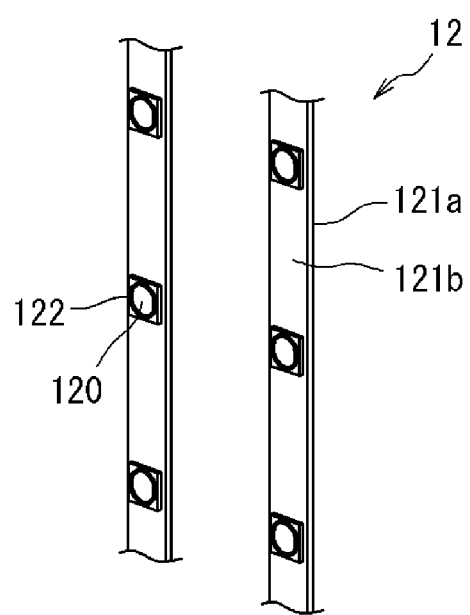
FIG. 3 is an enlarged view of a III portion in FIG. 2.

FIG. 3 is an enlarged view of a III portion in FIG. 2. In FIG. 3, the flexible printed circuit 12 includes an insulating base material 121a having insulating property, a pattern (for example, copper foil) 121b having conductivity and provided on the insulating base material 121a, power generating elements (solar cells) 122 provided thereon, and secondary concentrating portions 120 respectively provided so as to cover the power generating elements 122. The insulating base material 121a is made of, for example, a polyimide excellent in heat resistance.

Sets of the power generating element 122 and the secondary concentrating portion 120 are provided at positions corresponding to Fresnel lenses 13f of the primary concentrating portion 13, by the same number of the Fresnel lenses 13f. The secondary concentrating portion 120 concentrates sunlight incident from a corresponding Fresnel lens 13f onto the power generating element 122. The secondary concentrating portion 120 is a lens, for example. However, the secondary concentrating portion 120 may be a reflecting mirror that guides light downwardly while reflecting the light irregularly. Further, there is also a case where the secondary concentrating portion is not used.

Figure 4:
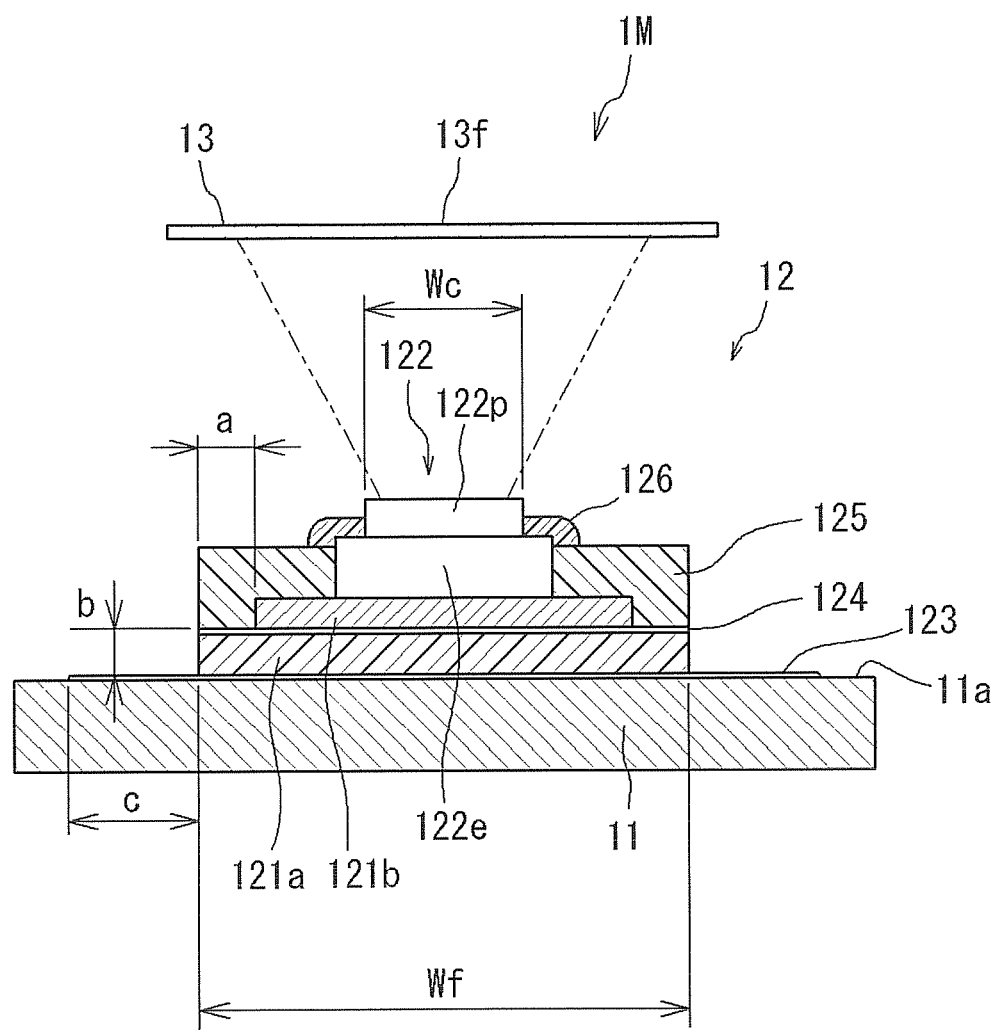
FIG. 4 is a cross-sectional view of a portion where a power generating element is provided, the cross-sectional view being orthogonal to the longitudinal direction of a flexible printed circuit.

FIG. 4 is a cross-sectional view of a portion where the power generating element 122 is provided, the cross-sectional view being orthogonal to the longitudinal direction of the flexible printed circuit 12. It should be noted that this drawing is depicted so as to facilitate viewing of a main part of the structure, and thicknesses and other dimensions are not necessarily in proportional to the actual dimensions.

In the drawing, the power generating element 122 (cell package 122p, electrode 122e) is positioned immediately below the Fresnel lens 13f of the primary concentrating portion 13 such that optical axes thereof are aligned with each other. The flexible printed circuit 12 is composed of the insulating base material 121a and the pattern 121b, and electronic components, optical component, and the like (here, the power generating element 122) mounted thereon.

The electrode 122e of the power generating element 122 is electrically connected to the pattern 121b. Between the insulating base material 121a and the bottom surface 11a of the housing 11, a bottom surface adhesive layer 123 formed of an adhesive having insulating property is provided. Moreover, the pattern 121b is covered with a cover lay 125 as a covering layer, and is not exposed. As a material of the cover lay 125, a material excellent in insulating property is appropriate, and for example, a polyimide material, an acrylic material, an epoxy material, or the like is appropriate. A voltage (DC) generated by photovoltaic occurs on the pattern 121b insulated from the housing 11. Thus, insulating performance means withstanding voltage performance and tracking resistance performance between the housing 11 and the pattern 121b.

The insulating base material 121a and the cover lay 125 are bonded to each other by an adhesive layer 124 formed of an adhesive having insulating property and a low water absorption not higher than a predetermined value. As a material of the adhesive layer 124, a material excellent in insulating property is appropriate, and a polyimide material, a silicone material, an acrylic material, an epoxy material, or the like is appropriate. It should be noted that also for the bottom surface adhesive layer 123, a similar material is appropriate.

In this manner, the conductive portion including the pattern 121b is covered and sealed with the cover lay (covering layer) 125 and the adhesive layer 124 each having insulating property and a low water absorption. As a result, a creepage distance from the conductive portion such as the pattern 121b to the bottom surface 11a of the housing 11 is ensured, and accordingly, excellent insulating performance can be realized. Moreover, by the cover lay 125 and the adhesive layer 124 each having a low water absorption, corrosion of the conductive portion can be prevented and deterioration over time can be suppressed.

The "predetermined value" above is 3%, for example. The water absorption is expressed by the weight of water in the weight of a target after the target has been immersed in water for 24 hours. If the water absorption is not higher than 3%, hardly any water is absorbed, and thus, excellent insulating performance can be maintained. In the case of over 3%, insulating performance is gradually deteriorated.

For reference, as the adhesive layer 124, an adhesive layer having a water absorption of 0.8 to 1.6%, for example, was used. The water absorption of the cover lay 125 was 2.4 to 2.6%. The water absorption of the insulating base material 121a was 1.4% to 2.7%. In the case of 2.7%, decrease in insulating resistance was observed when water was absorbed, but the reference value of withstanding voltage was narrowly satisfied. From these facts, it is seen that, also for the adhesive layer 124, the water absorption needs to be not higher than 3%.

With regard to the cell package 122p of the power generating element 122, the periphery thereof is covered with a potting layer 126 formed by a potting agent. Therefore, the electrode 122e is not exposed. The potting layer 126 also has insulating property and a low water absorption not higher than a predetermined value. Other than this, conductive portions, such as a diode, a solder connection portion, and the like not shown, that cannot be sufficiently covered with the cover lay 125 and are thus locally exposed are covered with the potting layer, whereby these conductive portions can be prevented from being exposed. Thus, insulating performance can be enhanced. Moreover, the width of the insulating base material 121a can be made close to the width of the element mounted thereon. Accordingly, a more slender insulating base material 121a can be used, and costs can be reduced.

It should be noted that the pattern 121b is insulated from the housing 11 by means of the insulating base material 121a and the bottom surface adhesive layer 123. The total thickness of the insulating base material 121a and the bottom surface adhesive layer 123 is preferably 10 to 100 μm. Accordingly, both insulating performance and heat dissipating property can be realized. That is, in the case of less than 10 μm, insulating performance is not sufficient. In the case of over 100 μm, heat dissipating property to the housing 11 is deteriorated. The thickness of the pattern 121b is about 35 μm, for example.

As shown in FIG. 4, the dimension between the edge of the cover lay 125 and the edge of the pattern 121b is "a", the dimension (substantially, the thickness of the insulating base material 121a) between the lower surface of the pattern 121b and the surface of the bottom surface adhesive layer 123 is "b", and the bottom surface adhesive layer 123 is set to be greater than, in the width, the insulating base material 121a by a dimension "c" ((greater by "2c" in total) in left-right symmetry). By the width of the bottom surface adhesive layer 123 being greater than the width of the insulating base material 121a by the dimension c in this manner, the creepage distance is extended. Accordingly, insulating performance can be enhanced.

Therefore, when viewed from the lower left corner of the pattern 121b being a conductive portion, the creepage distance to the bottom surface 11a becomes (a+b+c). As a numerical value example, it is preferable to ensure that "a" is not less than 0.2 mm, "b" is 25 μm or 12.5 μm, and "c" is not less than 25 μm. Further, as the total creepage distance of (a+b+c) (however, the value of "a" is most dominant), 0.2 to 34.9 mm is preferable. Accordingly, both insulating performance (withstanding voltage, tracking resistance) and low costs can be realized. That is, in the case of less than 0.2 mm, insulating performance cannot be sufficiently ensured. Realizing greater than 34.9 mm increases practical costs too much. It should be noted that 34.9 mm is the practical maximum dimension of the creepage distance, when the practical maximum dimension of the Fresnel lens 13f is assumed.

Further, a width Wf of the insulating base material 121a is preferably in the range of 0.6 to 70 mm. Accordingly, both insulating performance and low costs can be realized. That is, in the case of less than 0.6 mm, insulating performance cannot be sufficiently ensured. Realizing greater than 70 mm increases practical costs too much.

Further, the width of the pattern 121b is preferably 0.2 to 69.6 mm. Accordingly, both insulating performance and low costs can be realized. That is, in the case of less than 0.2 mm, not only insulating performance cannot be sufficiently ensured, but also stable manufacture at a low price cannot be realized. Realizing greater than 69.6 mm increases practical costs too much.

It should be noted that, with respect to a lower limit value of the width of the pattern 121b, when the pattern 121b is manufactured at a low price by use of, for example, etching, a known Thomson die, or the like, the dimensional tolerance is about ±0.1 mm. Therefore, by making the width of the pattern 121b 0.2 mm, even when the dimensional tolerance is taken into consideration, the flexible printed circuit can be stably manufactured, at a low price and at a high yield.

Here, supplementary explanation is given on mutual relation among the range of the width of the insulating base material 121a, the range of the width of the pattern 121b, and the range of the creepage distance which have been described above.

Figure 14:
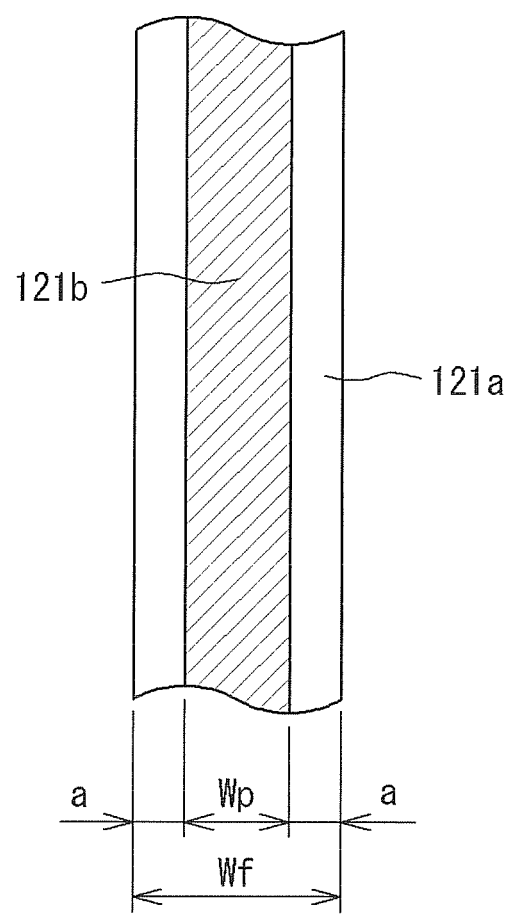
FIG. 14 is a plan view, as one example, of portions of an insulating base material and the pattern.

FIG. 14 is a plan view, as one example, of portions of the insulating base material 121a and the pattern 121b. In the drawing, when the width of the insulating base material 121a is Wf, the width of the pattern 121b is Wp, the equal width dimension that is on each side on the insulating base material 121a and that serves as a creepage distance is a, Wf=Wp+2·a. As described above, in the creepage distance (a+b+c), the value of "a" is most dominant, and thus, the creepage distance is substantially determined based on the value of "a".

Here, the practical maximum dimension of the Fresnel lens 13f (FIG. 2, FIG. 4) is considered to be 70 mm×70 mm. The reason for this is as follows. When a Fresnel lens having a dimension exceeding this dimension is used for concentration, temperatures of the power generating element 122 and the cell package 122p will exceed 120° C., and in such a case, the power generation efficiency extremely decreases, and in addition, a practical problem occurs that a low price resin cannot be employed for the cell package. Thus, in the case of a Fresnel lens of 70 mm×70 mm, in order to prevent adjacent insulating base materials 121a from overlapping each other, the maximum value of the width of the insulating base material 121a becomes 70 mm.

Next, the minimum value of the creepage distance a on one side is 0.2 mm as described above. Therefore, the maximum value of the width Wp of the pattern 121b of that case is (70 mm−2×0.2 mm)=69.6 mm. In reverse, the maximum value of the creepage distance a should be ½ of the value obtained by subtracting the minimum value of the width of the pattern 121b from the maximum value of the width of the insulating base material 121a. Thus, the creepage distance at this time is a=(70 mm−0.2 mm)/2=34.9 mm. On the other hand, the minimum value of the width Wf of the insulating base material 121a is determined by the sum of the minimum value of the pattern 121b and the minimum value of the creepage distance, and thus, 0.2 mm+2×0.2 mm=0.6 mm.

Therefore, as described above, the following preferable ranges are obtained.

The creepage distance a: 0.2 to 34.9 mm
The width Wf of the insulating base material: 0.6 to 70 mm
The width Wp of the pattern: 0.2 to 69.6 mm With reference back to FIG. 4, a preferable ratio between a width Wc of the cell package 122p and the width Wf of the insulating base material 121a is 1:(1.2 to 2). By this, both insulating performance and low costs can be realized. In the case of less than 1.2, that is, when the rate of the width Wf of the insulating base material 121a relative to the width Wc of the cell package 122p is less than 1.2, insulating property is deteriorated. When the rate of the width Wf of the insulating base material 121a relative to the width Wc of the cell package 122p exceeds 2, practical costs are increased too much.

Figure 11:
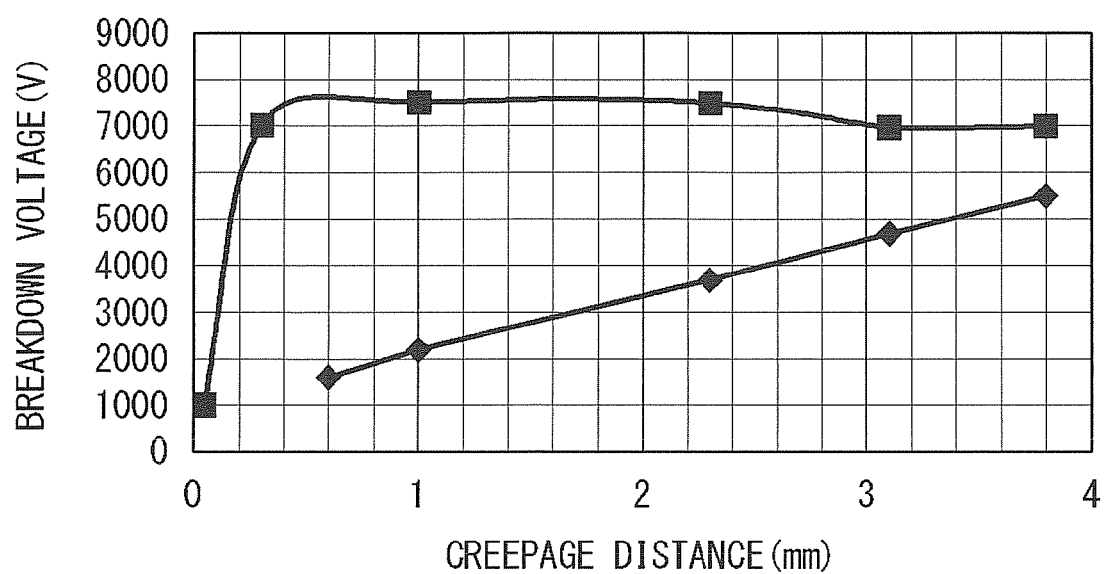
FIG. 11 is an example in which breakdown voltage between a pattern and the bottom surface is measured.

FIG. 11 is an example in which, among the above dimensions, only the dimension "a" was changed with b set to be 25 μm and "c" set to be 0, and the breakdown voltage between the pattern 121b and the bottom surface 11a was measured. The upper line represents a case where the cover lay 125 and the adhesive layer 124 were present, and the lower line represents a case where the cover lay was not present.

As clear from this graph, in the case where the cover lay 125 and the adhesive layer 124 were provided, even when the dimension "a" was only 0.2 mm to 0.3 mm, the breakdown voltage was 7000 V, which is an extremely good result. A breakdown voltage not less than 6000 V is excellent insulating performance of class A. On the other hand, in the case where the cover lay was not provided, when "a" was 0.6 mm, even 2000 V cannot be endured. Moreover, even when "a" was 3.8 mm, the breakdown voltage did not reach 6000 V.

Thus, even by ensuring the dimension a by the cover lay 125 and the adhesive layer 124, excellent insulating performance can be obtained. Further, by ensuring the creepage distances of b and c (especially c), insulating performance can be remarkably enhanced, and stable performance can be realized.

It should be noted that the material of the housing 11 is metal as described above, and for example, aluminum is suitable. By being made of metal, the housing 11 has good thermal conductivity. Therefore, heat dissipating property from the flexible printed circuit 12 to the housing 11 is especially good.

Moreover, the flexible printed circuit 12 and the like have a very light weight, and furthermore, the housing 11 is made of aluminum. Thus, the entirety of the concentrator photovoltaic module 1M also has a light weight. The light weight facilitates transportation. An example of the extent of this "light weight" is: in a case where the length, the breadth, and the depth of the module 1M are 840 mm, 640 mm, and 85 mm, respectively, a weight of not greater than 8 kg can be realized.

Figure 5:
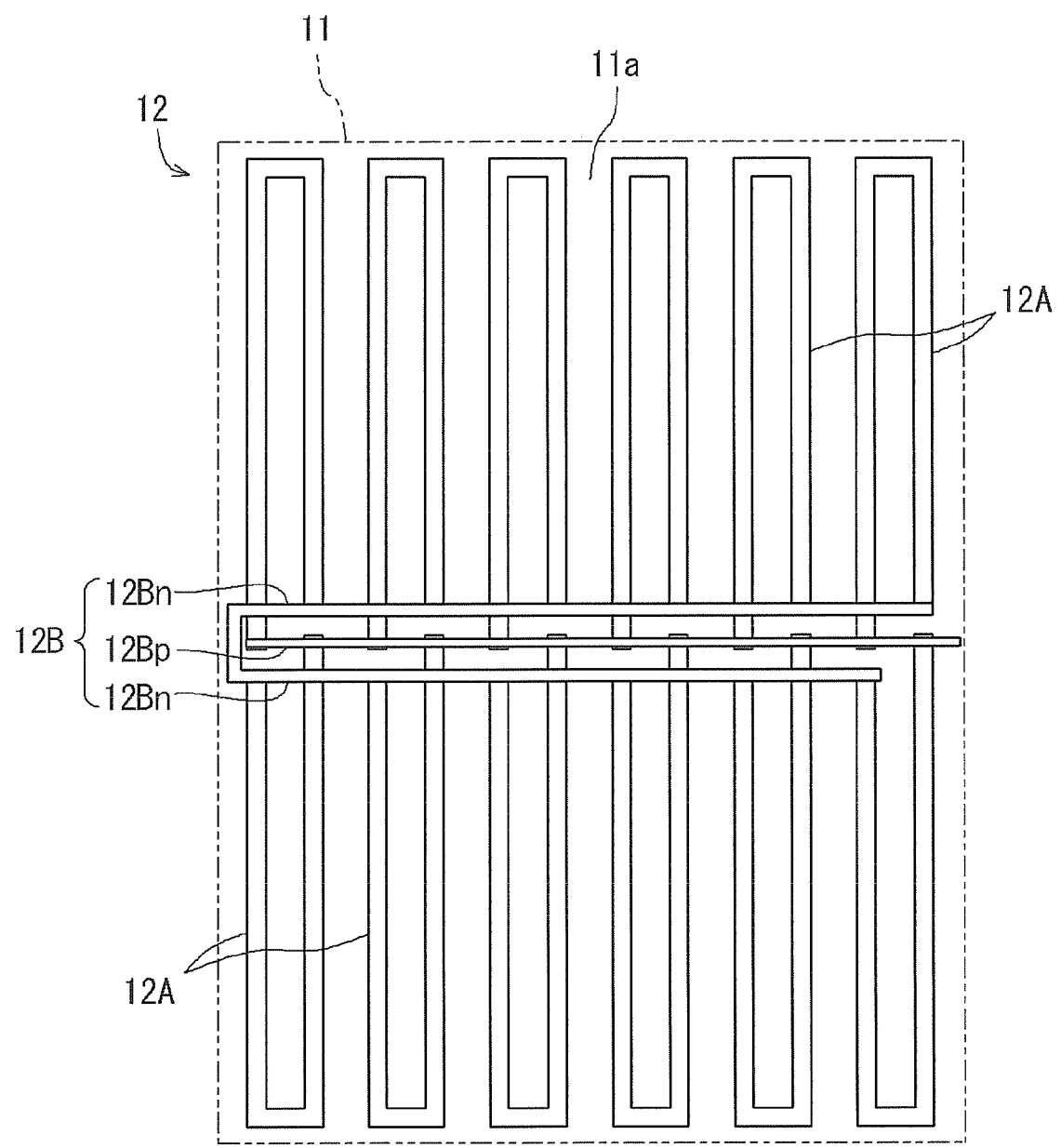
FIG. 5 is a plan view of one example of arrangement of the flexible printed circuit laid throughout on a bottom surface of a housing.

FIG. 5 is a plan view of one example of arrangement of the flexible printed circuit 12 (details are not shown) laid throughout on the bottom surface 11a of the housing 11. As shown, the flexible printed circuit 12 has a basic shape (shape of the insulating base material 121a) of a thin and slender ribbon, but by being arranged vertically and horizontally on the bottom surface 11a, the flexible printed circuit 12 can be laid throughout in a desired size (area), and thus, is suitable for a large-sized concentrator photovoltaic module 1M. That is, the entirety of the flexible printed circuit 12 formed by being laid throughout in this manner corresponds to one sheet of substrate or an assembly of a plurality of substrates having the same size. Moreover, because of this ribbon shape, the flexible printed circuit 12 can be laid throughout in a desired size while the area of the flexible printed circuit 12 is suppressed to a necessary minimum. Moreover, in the longitudinal direction of the insulating base material 121a, the power generating elements 122 can be arranged in advance at a certain interval.

This facilitates mutual positioning between each Fresnel lens 13f and a corresponding power generating element 122, and realizes excellent productivity.

The flexible printed circuit 12 shown in FIG. 5 is composed of, for example, 12 power generation circuits 12A, and a connection circuit 12B. Each power generation circuit 12A is formed in a U-shape. Such a shape may be formed by connecting linear portions or may be formed as one integral portion.

Each power generation circuit 12A has the same number of power generating elements mounted thereon, and can generate a predetermined voltage. As shown, by causing the power generation circuit 12A to have a shape extending from the middle of the bottom surface 11a toward the edge thereof and returning to the middle, a sufficient length of the power generation circuit 12A can be ensured. This facilitates, in order to obtain a desired voltage, arranging a necessary number of power generating elements and connecting them with each other in series. Moreover, by providing the connection circuit 12B in the middle so as to cross the power generation circuits 12A, it is possible to easily connect the 12 power generation circuits 12A with each other.

Figure 6:
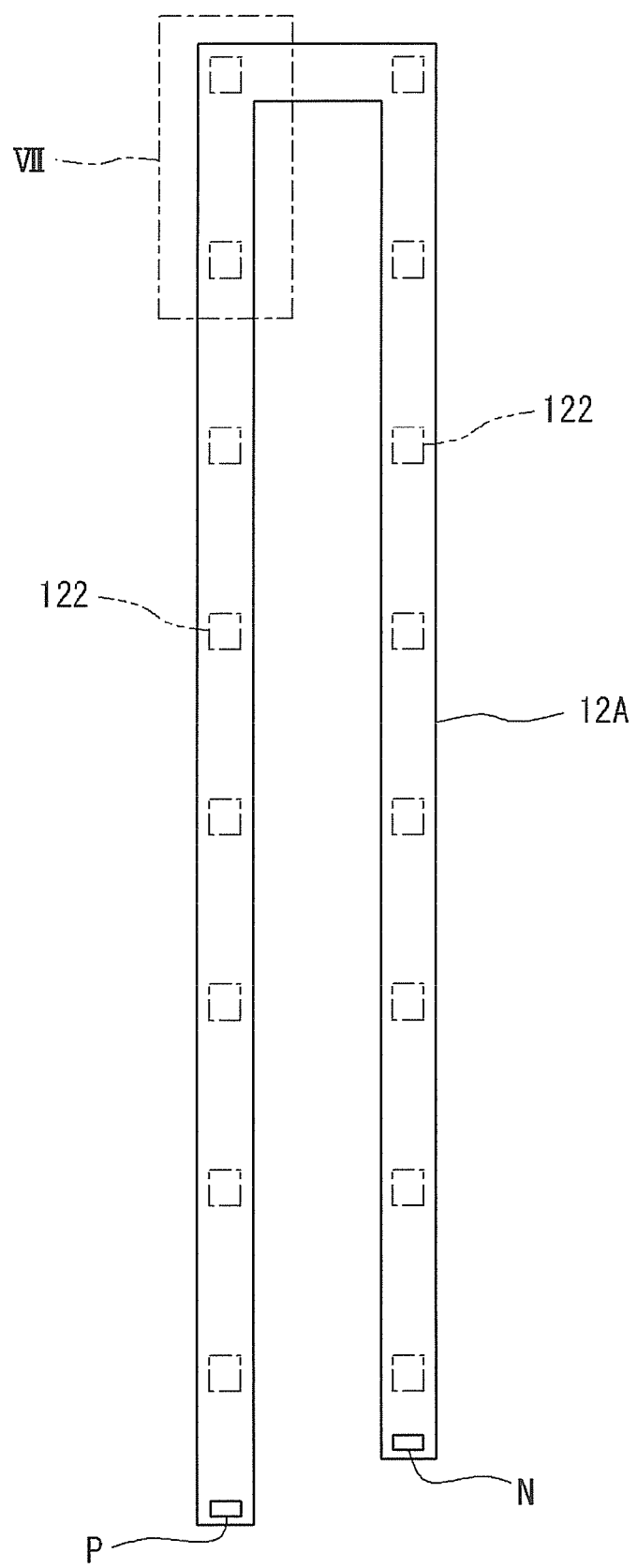
FIG. 6 is an enlarged view of a power generation circuit.

FIG. 6 is an enlarged view of the power generation circuit 12A. On the power generation circuit 12A, for example, 16 power generating elements 122 are mounted. The power generating elements 122 mounted on one power generation circuit 12A are all connected to each other in series. The voltage generated by one power generating element 122 is 2.5 V, and thus, a series body composed of 16 power generating elements 122 can generate a voltage of 40 V (2.5 V×16). This voltage occurs between a positive side electrode P and a negative side electrode N provided at two ends of the power generation circuit 12A.

Figure 7:
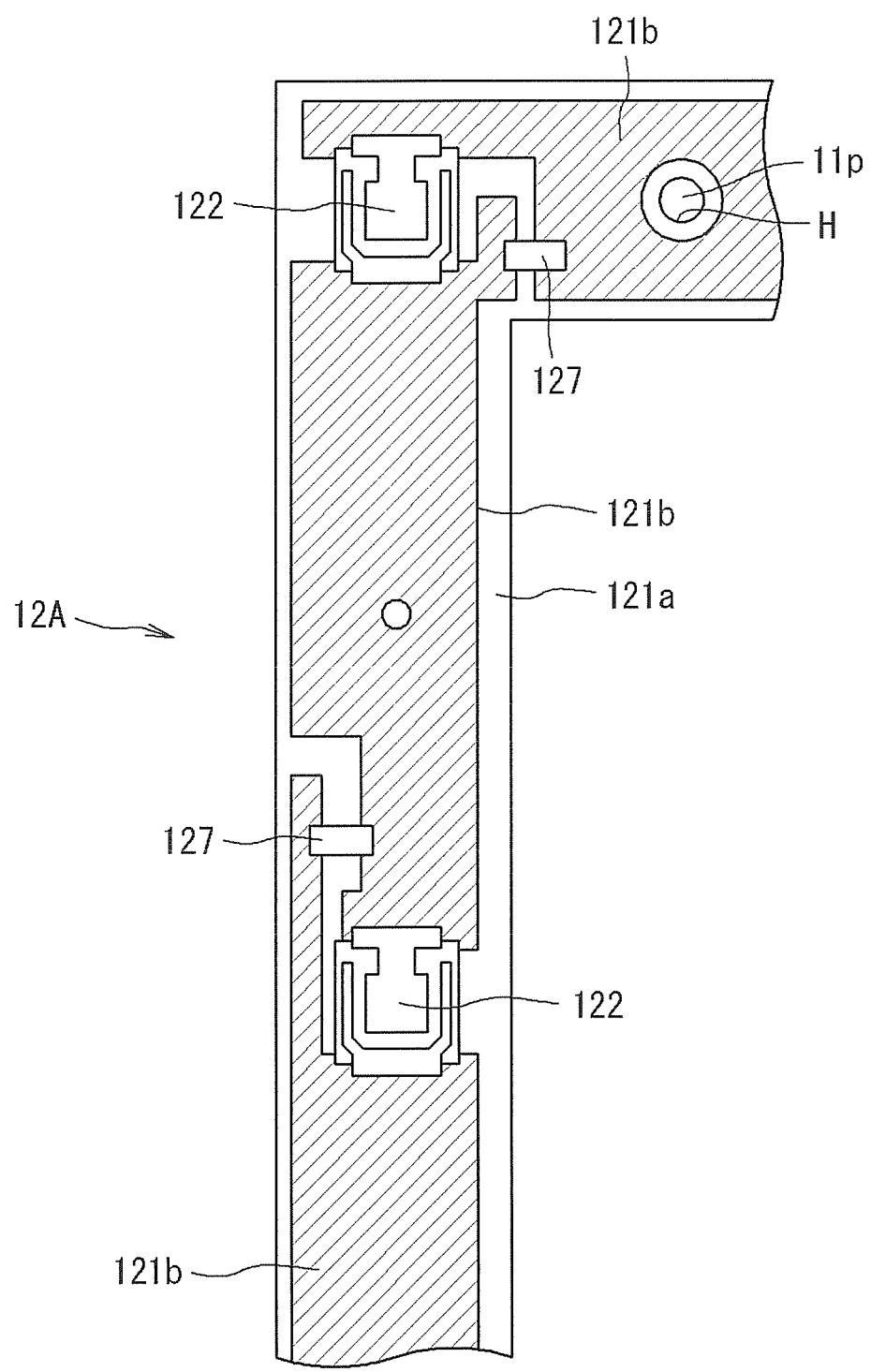
FIG. 7 is an enlarged view of a VII portion in FIG. 6.

FIG. 7 is an enlarged view of a VII portion in FIG. 6. In FIG. 7, the pattern 121b shown with diagonal lines is formed on the insulating base material 121a by etching or the like. Between the patterns 121b adjacent to each other, a power generating element 122 is inserted in series. Moreover, a diode 127 is provided in parallel with the power generating element 122 so as to form a bypass for the power generating element 122. The diode 127 is provided to short-circuit the patterns 121b adjacent to each other when the power generating element 122 does not generate power. Accordingly, even when there is a power generating element 122 that does not generate power locally due to a failure or the like, power generation as the entirety of the power generation circuit 12A is not prevented. As described above, each pattern 121b is covered with the cover lay 125 (FIG. 4), and each power generating element 122 and each diode 127 are provided with potting.

Moreover, the insulating base material 121a has positioning holes formed in, and a hole H being one of them is shown in FIG. 7. The pattern 121b is removed circularly around the hole H so as not to reach an edge of the hole H. By inserting, into the hole H, a cylindrical projection 11p formed on the bottom surface 11a of the housing 11, it is possible to position the power generation circuit 12A at a predetermined position relative to the housing 11. The connection circuit 12B can also be provided with a similar positioning structure.

It should be noted that the structure in which the hole H in the insulating base material 121a and the projection 11p on the housing 11 side are fitted with each other is merely one example, and it may be configured such that, by forming other various portions to be fitted with each other, positioning when attaching the flexible printed circuit 12 to the bottom surface 11a of the housing 11 can be easily and assuredly performed.

With reference back to FIG. 5, with respect to the output of the 12 power generation circuits 12A, the positive side electrodes P (FIG. 6) are connected to each other by a connection electric circuit 12Bp, and the negative side electrodes N (FIG. 6) are connected to each other by a connection electric circuit 12Bn. Accordingly, 12 parallel circuits of 40 V are formed, for example, and the entirety of one module 1M can supply 100 W (2.5 A) described above.

According to the structure of the module 1M using the flexible printed circuit 12 as described above, the flexible printed circuit 12 is thin and has a light weight. Thus, the entirety of the module 1M also has a light weight, and handling thereof becomes easy. In addition, the flexible printed circuit 12 is thin and flexible, and thus, is easily attached in close contact with the bottom surface 11a of the housing 11. Moreover, due to the close contact and the thinness, heat from the power generating element 122 and other flexible printed circuits can be assuredly dissipated to the housing 11.

Figure 8:
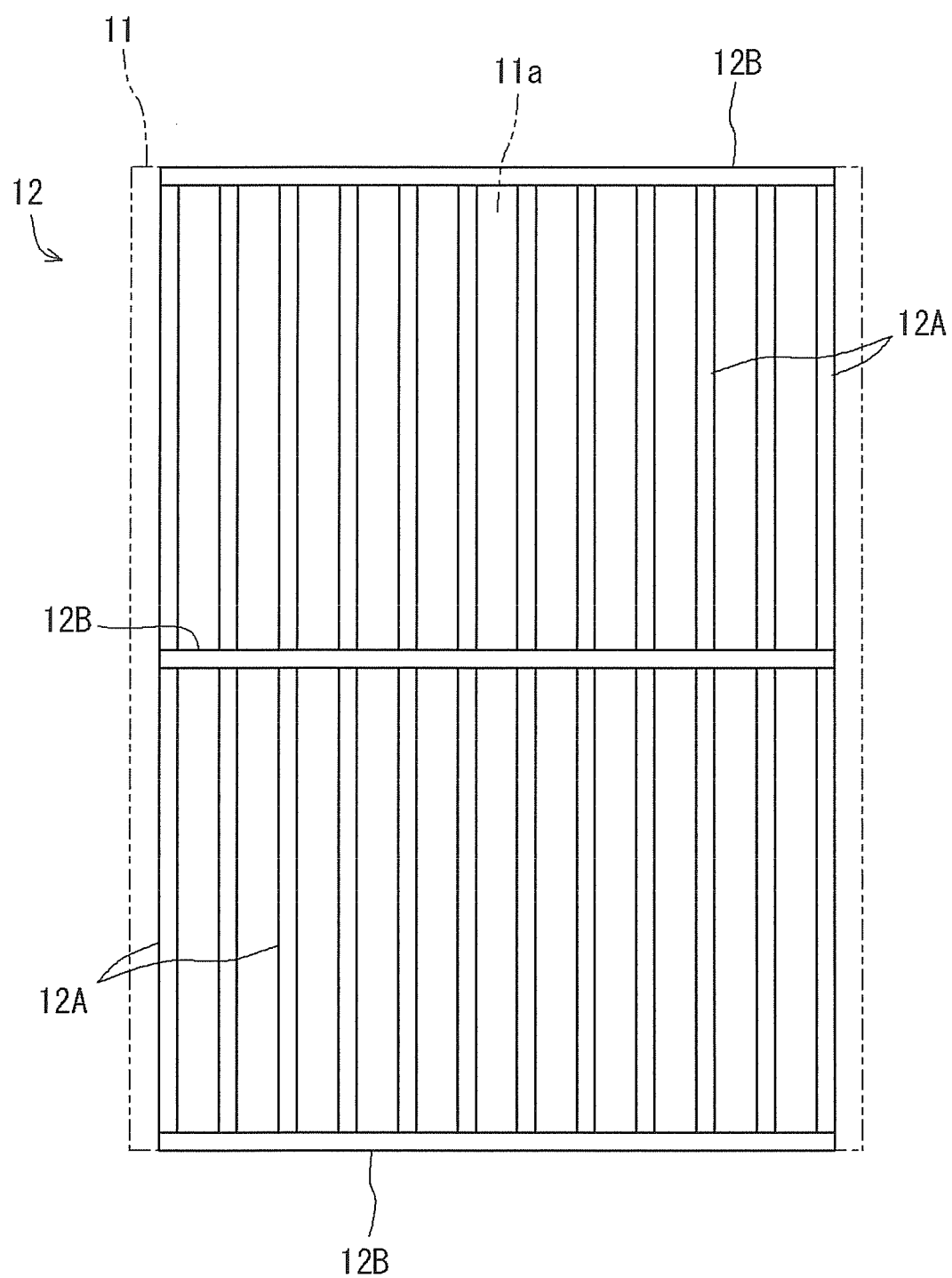
FIG. 8 is a plan view showing another example of arrangement of the flexible printed circuit.

It should be noted that the arrangement of flexible printed circuit shown in FIG. 5 is merely one example, and various modifications can be made as long as similar output is ensured. FIG. 8 is a plan view of another example of arrangement of the flexible printed circuit. In this case, each power generation circuit 12A has a simple linear shape, and the connection circuits 12B are provided at the middle and upper and lower edges. For example, the connection circuit 12B at the middle is for mutual connection of the power generation circuits 12A of the upper and lower stages, and the connection circuits 12B at the upper and lower edges are for positive and negative outputs.

Figure 9:
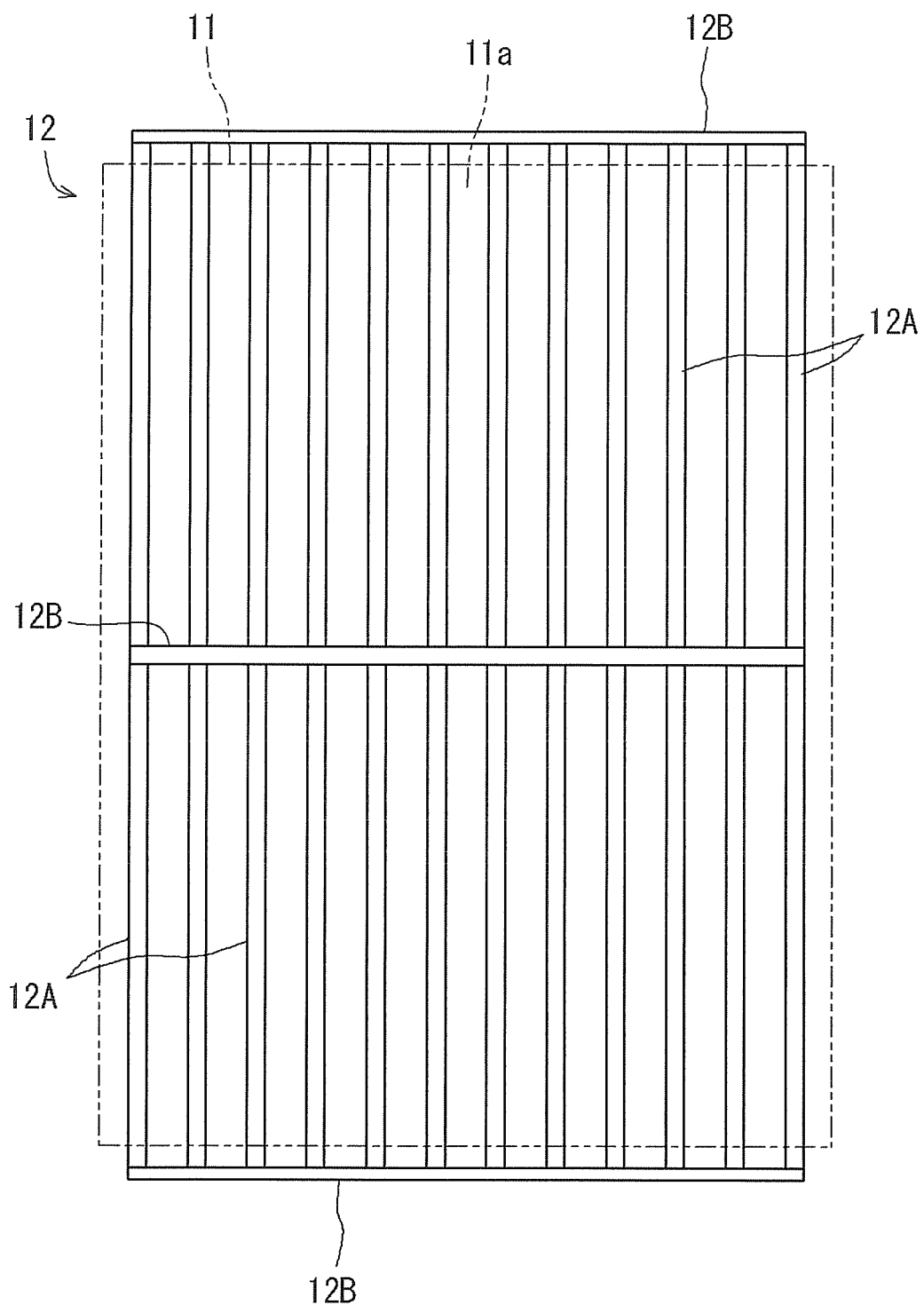
FIG. 9 is a plan view showing one example in which connection circuits are provided on inner side surfaces of the housing.

Since the connection circuits 12B need not be exposed to light in the first place, the connection circuits 12B may be provided on the inner side surfaces of the housing 11. FIG. 9 is a plan view showing one example in which the connection circuits 12B are provided on the inner side surfaces of the housing 11. That is, this is an example in which the connection circuits 12B at the upper and lower edges in FIG. 8 are extended so as to be positioned slightly over side surfaces (upper and lower sides in the drawing). Accordingly, the inner side surfaces of the housing 11 can also be utilized.

Figure 10:
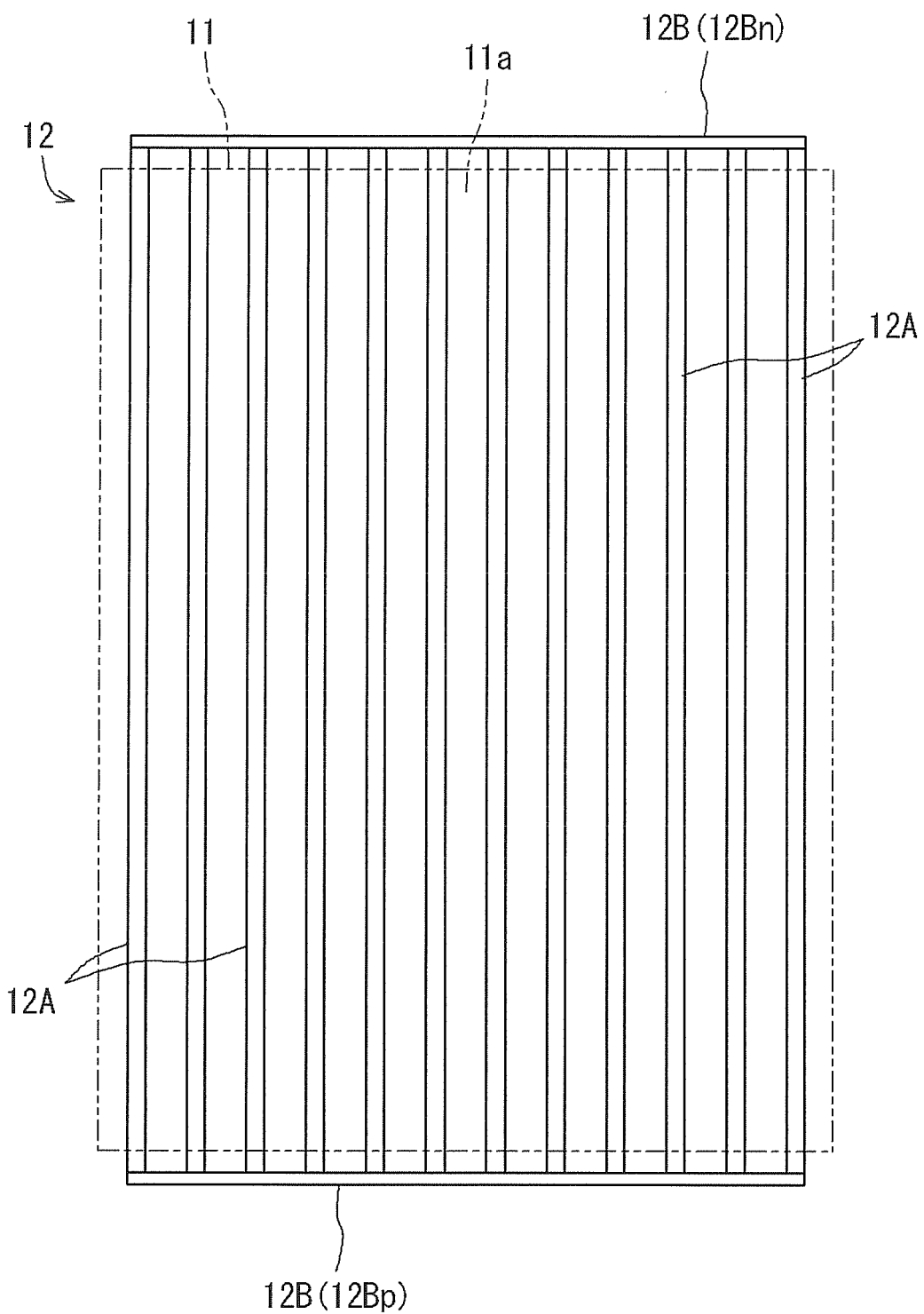
FIG. 10 is a plan view showing another example in which the connection circuits are provided on the inner side surfaces of the housing.

Further, FIG. 10 is a plan view showing another example in which the connection circuit 12B is provided on the inner side surfaces of the housing 11. That is, this is equivalent to the configuration of FIG. 9 from which the connection circuit 12B at the middle is omitted, and in which each power generation circuit 12A is provided in one piece extending in the longitudinal direction. On the upper and lower side surfaces in the drawing, the connection circuits 12B (12Bp, 12Bn) are provided, and the positive sides of the power generation circuits 12A are connected to each other, and the negative sides of the power generation circuits 12A are connected to each other. Accordingly, the inner side surfaces of the housing 11 can be utilized, and the connection circuit 12B at the middle can also be omitted.

Figure 12:
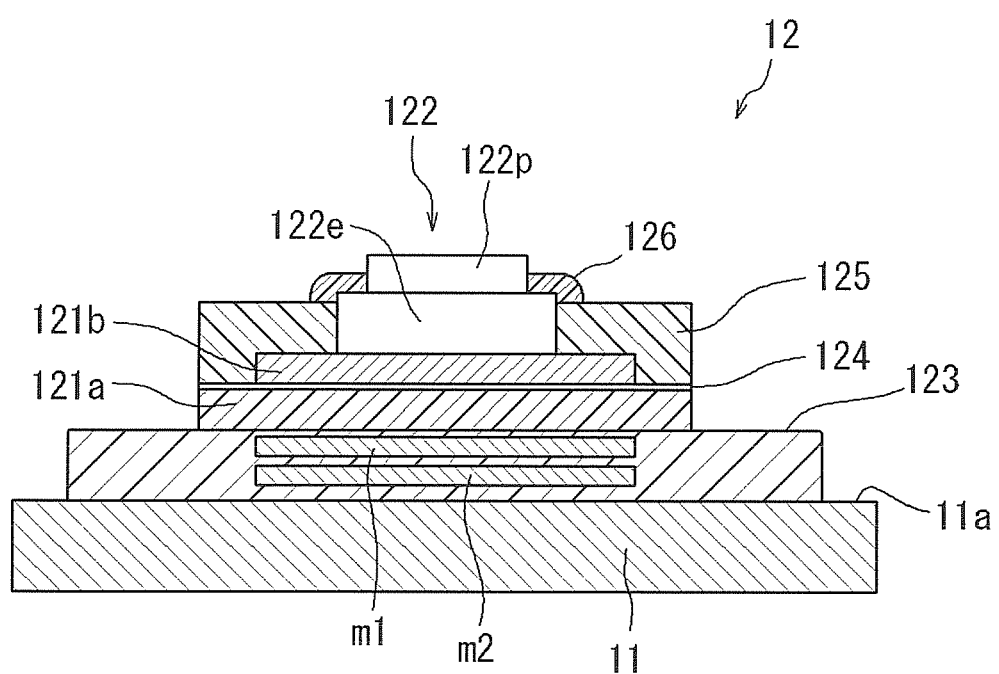
FIG. 12 is a cross-sectional view of a flexible printed circuit having a structure different from that in FIG. 4.

FIG. 12 is a cross-sectional view of the flexible printed circuit 12 having a structure different from that in FIG. 4. The difference from FIG. 4 is in the bottom surface adhesive layer 123, and the other structures are the same. The bottom surface adhesive layer 123 shown in FIG. 12 is depicted so as to be thicker than the actual dimension, for convenience in showing the structure. The bottom surface adhesive layer 123 is obtained by enclosing and fixing thin metal plates m1 and m2 inside the adhesive made of insulating resin. The plurality of (two, herein) the metal plates m1 and m2 are distanced from each other as shown, and are enclosed so as not to be exposed from both of the upper and lower end surfaces of the bottom surface adhesive layer 123. However, the upper metal plate m1 is positioned close to the surface of the bottom surface adhesive layer 123.

In the flexible printed circuit 12 as structured in FIG. 12, for validation of insulating performance, a DC voltage is applied between the pattern 121b and the housing 11. In this case, the two metal plates m1 and m2 are interposed between the pattern 121b and the housing 11, and between these, an insulating material, i.e., a dielectric exists.

Figure 13:
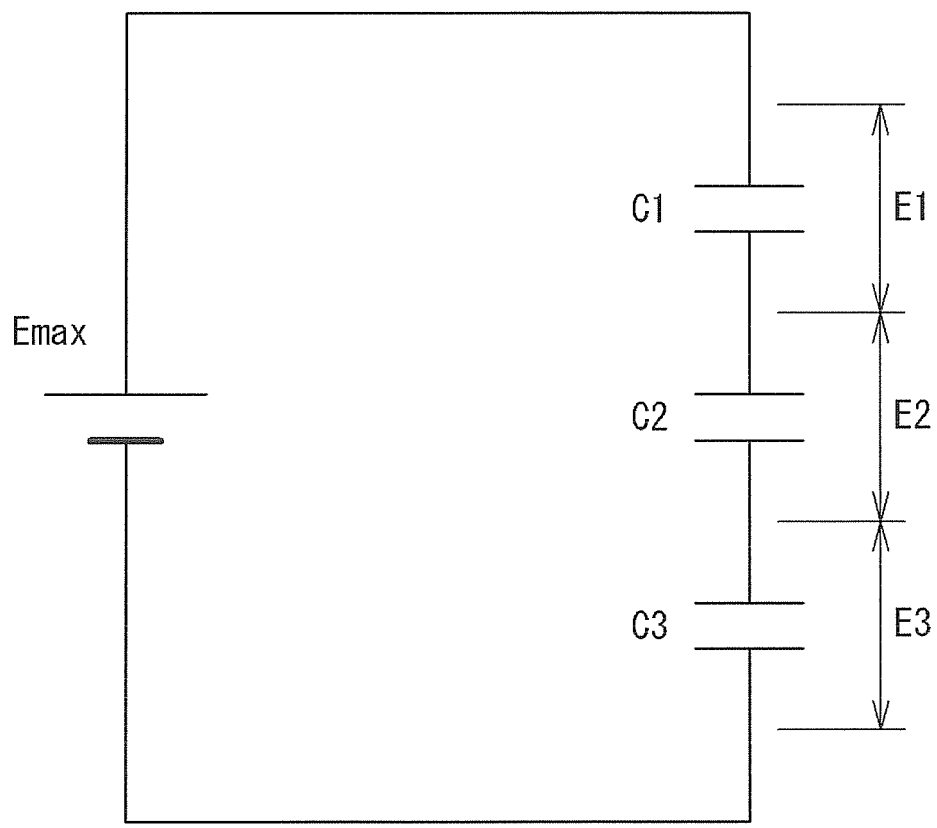
FIG. 13 is an equivalent circuit when a DC voltage is applied between the pattern and the housing.

FIG. 13 is an equivalent circuit when a DC voltage Emax is applied between the pattern 121b and the housing 11. Between the pattern 121b and the housing 11, three capacitances in series with each other exist. A capacitance C1 exists between the pattern 121b and the metal plate m1. A capacitance C2 exists between the metal plate m1 and the metal plate m2. A capacitance C3 exists between the metal plate m2 and the housing 11. With regard to the capacitances C1, C2, and C3, between their both ends, voltages E1, E2, and E3 are applied, respectively.

Basically, the capacitance between two electrodes is proportional to ($\in$A/d) ($\in$: permittivity, A: area, d: thickness). In order to improve the withstanding voltage of the capacitance C1, it is necessary that C2 and C3 are greater than C1. That is, the permittivity of the bottom surface adhesive layer 123 and the areas of the metal plates m1 and m2 are selected so as to realize C1<C2 and C1<C3.

Here, when the maximum withstanding voltage that can be applied to the capacitance C1 is E1max, each of the capacitances C1 to C3 has the same electric charge Q, and thus, the following formulae (1) to (3) are obtained.

$$Q = E1\text{max} \cdot C1 \quad (1)$$

$$Q = E2 \cdot C2 \quad (2)$$

$$Q = E3 \cdot C3 \quad (3)$$

Here, based on the above formulae (1) to (3), when the voltages E2 and E3 are expressed by use of E1max, the following is obtained.

$$E2 = (C1/C2) \cdot E1\text{max} \quad (4)$$

$$E3 = (C1/C3) \cdot E1\text{max} \quad (5)$$

Therefore, the entire withstanding voltage Emax is expressed by the following formula (6), and a greater withstanding voltage than in the case of a single capacitance C1 can be obtained.

$$\begin{aligned} E\text{max} &= E1\text{max} + E2 + E3 \\ &= E1\text{max} \cdot \{1 + (C1/C2) + (C1/C3)\} \end{aligned} \quad (6)$$

In this manner, the insulating performance of the insulating base material 121a relative to the housing 11 can be enhanced. In FIG. 12, the two metal plates m1 and m2 are shown. However, one metal plate, or three or more metal plates may be enclosed in the bottom surface adhesive layer 123.

It is noted that the embodiment disclosed therein is merely illustrative in all aspects and should not be recognized as being restrictive. The scope of the present invention is defined by the scope of the claims, and is intended to include meaning equivalent to the scope of the claims and all modifications within the scope.

REFERENCE SIGNS LIST 1 concentrator photovoltaic panel
1M concentrator photovoltaic module
2 post
3 base
11 housing
11a bottom surface
11b flange portion
11p projection
12 flexible printed circuit
12A power generation circuit
12B, 12Bp, 12Bn connection circuit
13 primary concentrating portion (concentrating portion)
13f Fresnel lens (lens element)
14 connector
100 concentrator photovoltaic apparatus
121a insulating base material
121b pattern
122 power generating element
122e electrode
122p cell package
123 bottom surface adhesive layer
124 adhesive layer
125 cover lay (covering layer)
126 potting layer
127 diode
m1, m2 metal plate
H hole
P positive side electrode
N negative side electrode

The invention claimed is:

1. A concentrator photovoltaic module comprising:
a housing formed in a vessel shape and having a bottom surface;
a flexible printed circuit provided in contact with the bottom surface, the flexible printed circuit including a ribbon shaped base in which, except for a thickness direction, a large dimension is a longitudinal direction and a short dimension is a widthwise direction; and
a concentrating portion attached to the housing and formed by a plurality of lens elements being arranged, each lens element concentrating sunlight, wherein
the flexible printed circuit includes:
an insulating base material to be arrayed on the bottom surface, the insulating base material having insulating property;
a pattern having conductivity and provided on the insulating base material, the pattern having a width smaller than a width of the insulating base material to thereby secure a creepage distance between both ends of the insulating base material and respective ends of the pattern in the widthwise direction;
a plurality of power generating elements provided on the pattern and arranged in the longitudinal direction, so as to correspond to the lens elements, respectively;
a covering layer having insulating property, the covering layer covering and sealing a conductive portion including the pattern on the insulating base material; and
an adhesive layer having insulating property, the adhesive layer bonding the insulating base material and the covering layer together, wherein each of the insulating base material, the covering layer and the adhesive layer having a low water absorption not higher than 3% when the water absorption is expressed by a weight of water in a weight of a target after the target has been immersed in water, and
wherein the covering layer makes contact with:
a top end face of the pattern;
an outer side-end face in the widthwise direction of the pattern; and
a top end face of the insulating base material via the adhesive layer.

2. The concentrator photovoltaic module according to claim 1, wherein
the insulating base material is attached to the bottom surface via a bottom surface adhesive layer having insulating property.

3. The concentrator photovoltaic module according to claim 1, wherein
a potting layer is provided which covers a portion, including the power generating element, where the conductive portion is locally exposed, and
the potting layer has insulating property and a water absorption not higher than 3%.

4. The concentrator photovoltaic module according to claim 1, wherein a creepage distance from the pattern to the bottom surface is 0.2 to 34.9 mm.

5. The concentrator photovoltaic module according to claim 1, wherein a width of the insulating base material is 0.6 to 70 mm.

6. The concentrator photovoltaic module according to claim 1, wherein a width of the pattern is 0.2 to 69.6 mm.

7. The concentrator photovoltaic module according to claim 1, wherein a ratio between a package width of the power generating element and a width of the insulating base material is 1:(1.2 to 2).

8. The concentrator photovoltaic module according to claim 1, wherein a width of the bottom surface adhesive layer is greater than a width of the insulating base material.

9. The concentrator photovoltaic module according to claim 1, wherein inside the bottom surface adhesive layer, at least one metal plate is provided in a thickness direction of the layer.

10. A concentrator photovoltaic panel formed by assembling a plurality of the concentrator photovoltaic modules according to claim 1.

11. A flexible printed circuit for a concentrator photovoltaic module, including a ribbon shaped base in which, except for a thickness direction, a large dimension is a longitudinal direction and a short dimension is a widthwise direction, the flexible printed circuit comprising:
an insulating base material to be arrayed on a bottom surface of a housing, the insulating base material having insulating property;
a pattern having conductivity and provided on the insulating base material, the pattern having a width smaller than a width of the insulating base material to thereby secure a creepage distance between both ends of the insulating base material and respective ends of the pattern in the widthwise direction;
a plurality of power generating elements provided on the pattern and arranged in the longitudinal direction;
a covering layer having insulating property, the covering layer covering and sealing a conductive portion including the pattern on the insulating base material; and an adhesive layer having insulating property, the adhesive layer bonding the insulating base material and the covering layer together, wherein each of the insulating base material, the covering layer and the adhesive layer having a low water absorption not higher than 3% when the water absorption is expressed by a weight of water in a weight of a target after the target has been immersed in water, wherein the covering layer makes contact with:
- a top end face of the pattern;
- an outer side-end face in the widthwise direction of the pattern; and
- a top end face of the insulating base material via the adhesive layer.

\* \* \* \* \*